(12) United States Patent
Kim

(10) Patent No.: US 6,269,251 B1
(45) Date of Patent: Jul. 31, 2001

(54) METHOD OF CALCULATING A CODE VALUE FOR ELECTRIC POWER CONTROL ACCORDING TO TEMPERATURE COMPENSATION IN WIRELESS COMMUNICATION TERMINAL

(75) Inventor: Hak-Hwan Kim, Kumi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/528,392

(22) Filed: Mar. 20, 2000

(30) Foreign Application Priority Data

Mar. 20, 1999 (KR) .................................................... 99-9536

(51) Int. Cl.$^7$ ...................................................... H04B 7/00

(52) U.S. Cl. .............................. 455/522; 455/127; 455/76

(58) Field of Search ........................................ 455/522, 127, 455/76, 249.1, 245.1, 89; 330/289, 130, 279

(56) References Cited

U.S. PATENT DOCUMENTS

| | | | |
|---|---|---|---|
| 5,081,713 | * | 1/1992 | Miyazaki ................................ 455/76 |
| 5,337,006 | * | 8/1994 | Miyazaki .............................. 330/130 |
| 5,697,081 | * | 12/1997 | Lyall, Jr. ............................. 455/249.1 |

* cited by examiner

*Primary Examiner*—Nguyen T. Vo
*Assistant Examiner*—John J. Lee
(74) *Attorney, Agent, or Firm*—Dilworth & Barrese, LLP

(57) ABSTRACT

Disclosed is a method of controlling electric power according to a temperature compensation for a wireless communication terminal including a memory for storing each of code values of a maximum and minimum power according to a temperature variation and each of weight values for sending power, comprising the steps of; (a) calculating a compensation value at an associated sending power according to a reference temperature; (b) calculating a basic code value at an associated sending power according to a reference temperature; and (c) obtaining a compensated code value by adding the compensation value to the basic code value.

9 Claims, 7 Drawing Sheets

TEMPERATURE Tx AGC LEVEL dBm: 24.0, 22.0, 18.1, 11.8, 6.3, 1.0, −4.3, −9.7, −20.0, −35.0, −45.0, −55.0

TEMPERATURE (−20°C ~ 50°C)

| dBm / TEMPERATURE | 24.0 | 22.0 | 18.1 | 11.8 | 6.3 | 1.0 | −4.3 | −9.7 | −20 | −35 | −45 | −55 |
|---|---|---|---|---|---|---|---|---|---|---|---|---|
| 0 | 201 | 193 | 179 | 159 | 144 | 130 | 117 | 106 | 87 | 62 | 51 | 42 |
| 10 | 206 | 197 | 181 | 160 | 145 | 130 | 117 | 105 | 85 | 60 | 43 | 34 |
| 30 | 208 | 199 | 183 | 161 | 145 | 130 | 117 | 105 | 84 | 59 | 40 | 32 |
| 50 | 211 | 202 | 186 | 163 | 147 | 131 | 117 | 105 | 83 | 57 | 36 | 25 |
| 70 | 213 | 204 | 187 | 164 | 147 | 131 | 117 | 105 | 83 | 57 | 35 | 24 |
| 90 | 216 | 206 | 188 | 165 | 148 | 131 | 117 | 105 | 83 | 56 | 34 | 20 |
| 100 | 218 | 206 | 189 | 165 | 148 | 131 | 117 | 105 | 83 | 55 | 32 | 19 |
| 120 | 219 | 208 | 191 | 166 | 148 | 132 | 117 | 104 | 82 | 54 | 30 | 15 |
| 150 | 224 | 213 | 195 | 170 | 151 | 134 | 118 | 105 | 82 | 54 | 27 | 12 |
| 180 | 231 | 220 | 201 | 174 | 154 | 136 | 120 | 106 | 83 | 53 | 24 | 6 |
| 200 | 237 | 226 | 205 | 177 | 157 | 138 | 121 | 107 | 82 | 52 | 22 | 2 |

TABLE

| AMPLIFIER POWER(dBm) | 25 | 20 | 15 | 10 | 5 | 0 | −5 | −10 | −15 | −20 | −25 | −30 | −35 | −40 | −45 | −50 |
|---|---|---|---|---|---|---|---|---|---|---|---|---|---|---|---|---|
| Tx AGC LEVEL | 250 | 222 | 196 | 172 | 149 | 127 | 108 | 91 | 77 | 66 | 55 | 46 | 37 | 30 | 25 | 21 |

TABLE

A GRAPH SHOWING A CHANGED CODE OF AN OUTPUT POWER LEVEL
BY SETTING TEMPERATURE CODE 100 TO A REFERENCE

METHOD OF CALCULATING A CODE VALUE FOR ELECTRIC POWER CONTROL ACCORDING TO TEMPERATURE COMPENSATION IN WIRELESS COMMUNICATION TERMINAL

BACKGROUND OF THE INVENTION

1. Field of the Invention

The present invention relates to electric power control of a wireless communication terminal, and more particularly to a control algorithm for compensating a loss due to a temperature variation in a wireless communication terminal.

2. Description of the Related Art

In general, a wireless communication terminal is designed to control its transmitting power depending on a variation in a distance between the wireless communication terminal and a base station. As the wireless communication terminal is moved away from the base station, the required amount of sending power of the wireless communication terminal increases, whereas as the wireless communication terminal is moved near to the base station, the required amount of sending power of the wireless communication terminal decreases. Practically, the sending power of the wireless communication terminal is controlled in such a fashion that it is inversely proportional to a received signal strength indicator (RSSI) measured in the wireless communication terminal.

For example, in a case where both a wireless communication terminal A located apart from a base station by 100 m and another wireless communication terminal B located apart from the base station by 1 km send simultaneously a signal to the base station at a same power level, respectively, since the terminal B is 10 times as remote as the terminal A from the base station, there is $10^3 \sim 10^5$ difference in power received at the base station from terminal A and terminal B. In this case, the base station cannot restore the signal received from terminal B. As mentioned above, when two terminals A and B located apart from the base station by a distance different from each other send simultaneously signals to the base station at a same power level, respectively, there has been a problem in that, it is impossible for the base station to restore the received signal of the terminal B relatively remote from the base station. The problem is called "a near-far interference problem". When a sending/received power level is very low, a bit error rate becomes high, whereas when the sending/received power level is very high, another terminal (especially a remote terminal, such as terminal B) receives great interference, which results in a deterioration of system performance. Accordingly, appropriate regulation of sending output of a wireless communication terminal should allow a signal received by the base station to generate the minimum power ratio of signal to interference. This power control enables reduction of power consumption of a wireless communication terminal and increases subscriber capacity.

As shown in FIG. 3, a wireless communication terminal controls electric power using a code. However, the ratio of input to output of an amplifier are as shown in FIG. 1a. The ideal ratio of input to output of the amplifier represents a linear characteristic as shown in FIG. 1b. But, the input/output characteristic of an actually implemented amplifier is indicated by a nonlinear form or an exponential form as shown in FIG. 1A and depends on factors such as constituent circuits of the wireless communication terminal, a temperature of the wireless communication terminal, and a frequency band in use.

Particularly, an output characteristic of the amplifier can be changed depending on a temperature variation as shown in FIGS. 2A and 2B. There has been a problem in that, for a signal having a high decibel (dB), as a temperature increases, an output value increases, whereas for a signal having a low decibel (dB), as a temperature increases, an output value decreases. See FIG. 2a. Accordingly, storage of output values depending on a temperature variation for each signal allows electric power to be controlled as shown in FIG. 2b. But, in this case, a problem arises in that, the capacity of a memory in use grows. Consequently, conventionally, a temperature table which records output value of each signal depending on a high temperature, the normal temperature, and a low temperature had been stored, and then electric power for output has been determined on the basis of the stored temperature table. However, consideration of only three options makes it impossible to precisely control the output electric power.

SUMMARY OF THE INVENTION

Therefore, an object of the present invention is to provide a method of controlling precisely the strength of an output signal according to a temperature variation.

It is another object of the invention to provide a method of controlling precisely the strength of an output signal while reducing the use of a memory.

In order to achieve the above object, according to the present invention, there is provided a method of controlling electric power according to a temperature compensation for a wireless communication terminal including a memory for storing each of code values for a maximum and minimum power corresponding to a plurality of temperature variations and weight values for a plurality of sending powers, comprising the steps of;

(a) calculating a compensation value at an associated sending power with respect to a reference temperature;

(b) calculating a basic code value at an associated sending power with respect to a reference temperature; and (c) obtaining a compensated code value by adding the compensation value to the basic code value.

According to another aspect of the present invention, there is also provided a method of controlling electric power according to a temperature compensation for a wireless communication terminal including a memory for storing code values of a maximum and minimum power corresponding to a temperature variation and weight values for a plurality of sending powers, comprising the steps of;

(a) calculating a compensation value at an associated sending power which is proportional to both the ratio of a maximum to minimum sending power at a reference temperature and a weight value corresponding to the sending power;

(b) calculating a basic code value as the amount of a code variation at an associated sending power from a linear function according to code values of a maximum and minimum sending power at a reference temperature; and (c) obtaining a compensated code value by adding the compensation value to the basic code value.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENT

Reference will now be made in greater detail to the preferred embodiments of the present invention. In the following description of the present invention, numerous concrete specific details are set forth to provide a more thorough understanding of the present invention. It will be apparent, however, to those skilled in the art that the invention may be practiced otherwise than according to the previously mentioned specific details. The detailed description of known functions and configurations incorporated herein will be omitted when it may make the subject matter of the present invention rather unclear.

Figures 2A, 2B:
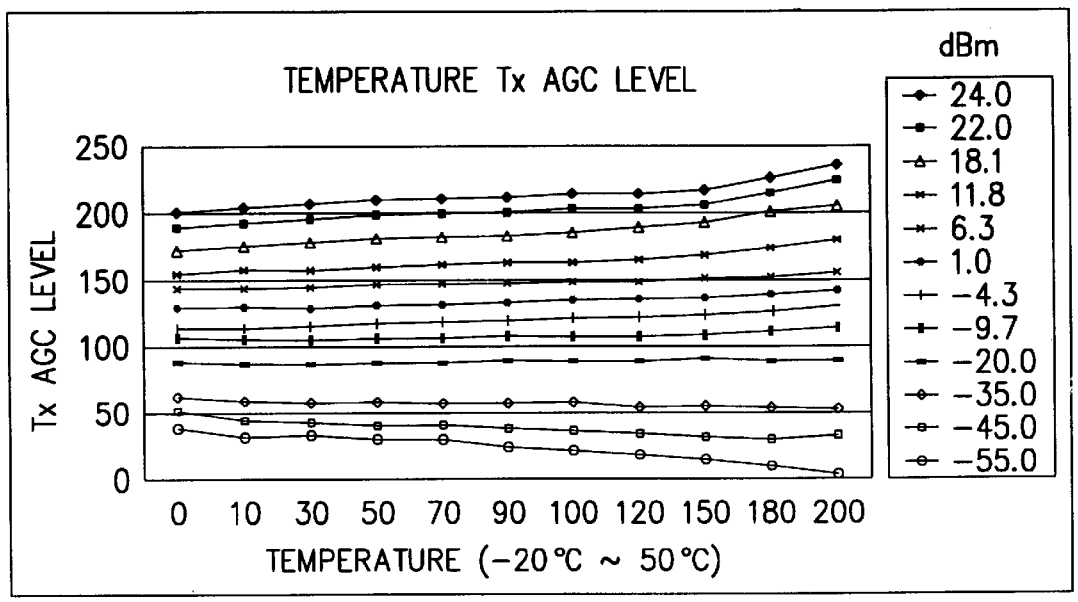
FIG. 2a is a graph illustrating a changed output signal value according to the strength of a signal and a temperature variation.
FIG. 2b is a chart representing signal strength compensation based on temperature change.
Figure 3:
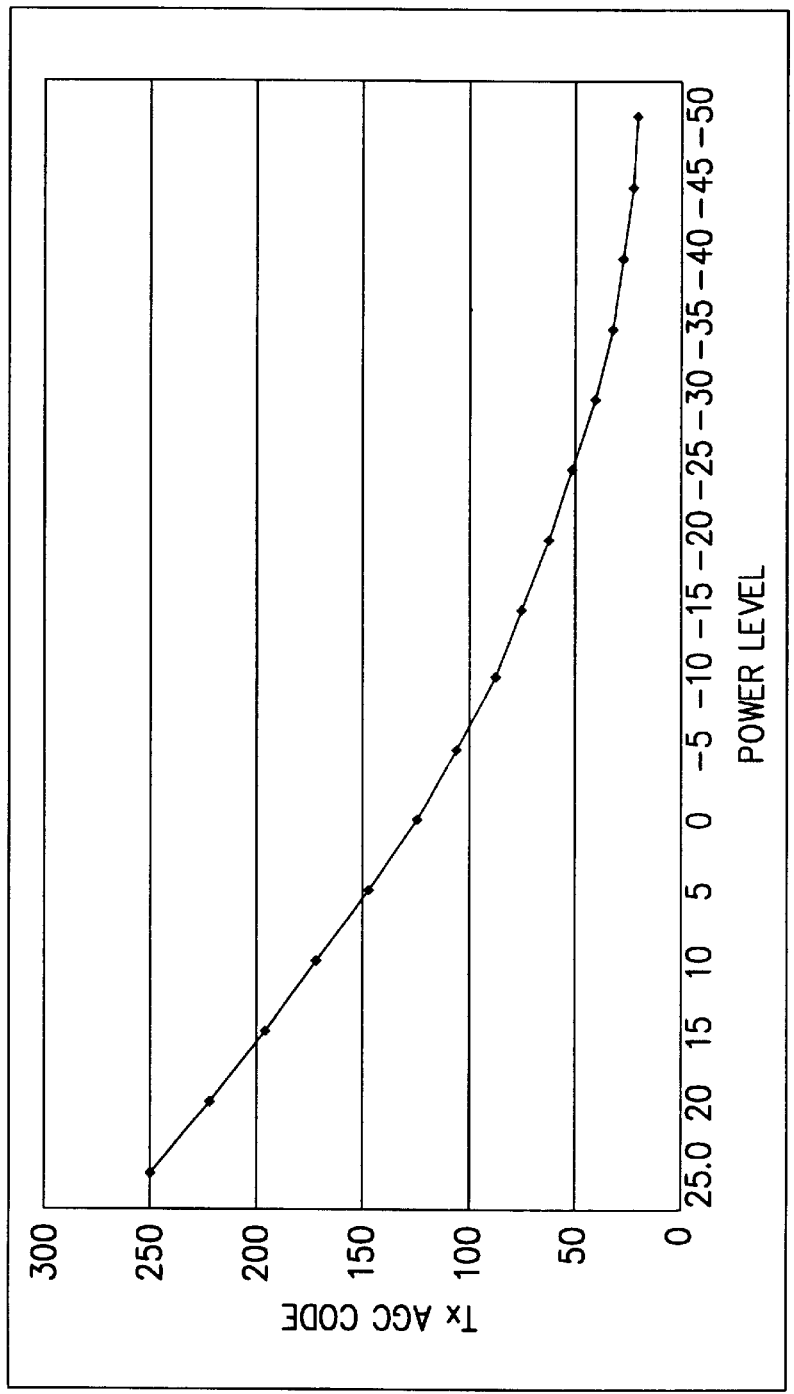
FIG. 3 is a graph illustrating a changed output power level according to a code variation.
Figure 4:
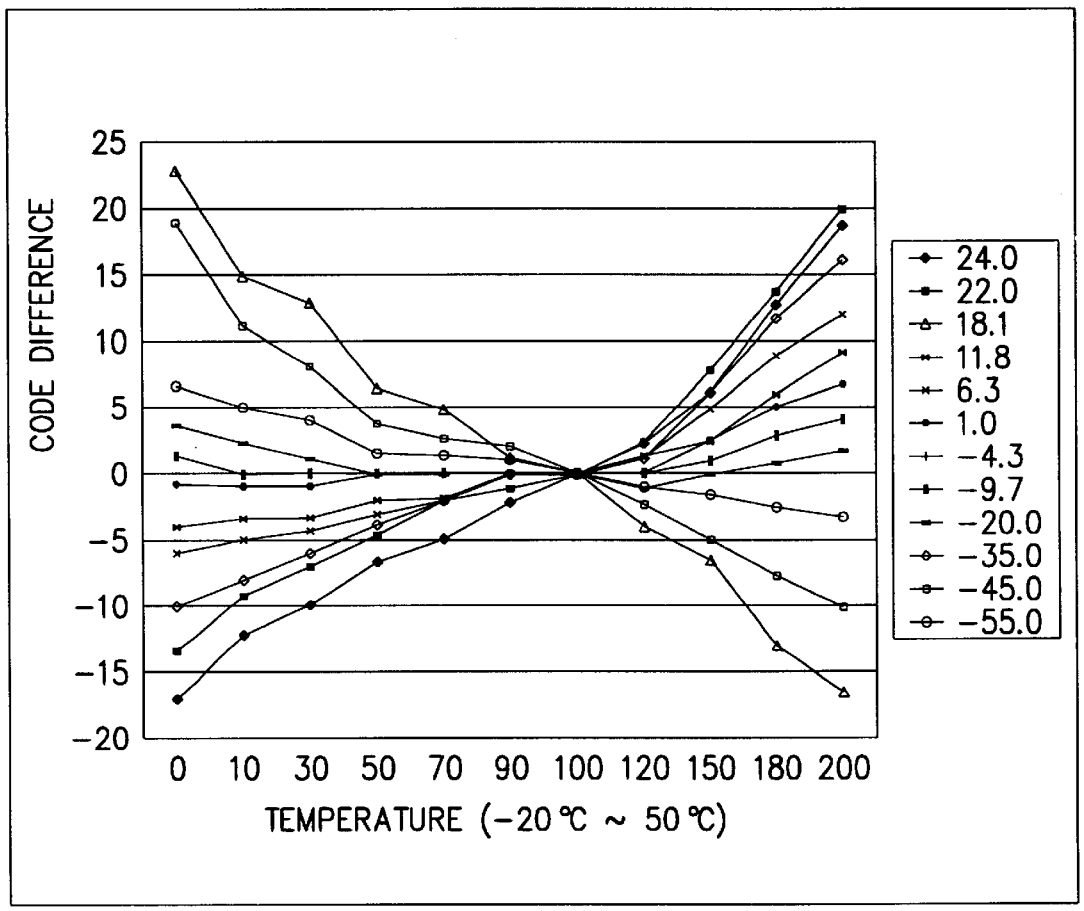
FIG. 4 is a graph illustrating a changed code of an output power level by setting temperature code 100 to a reference.

FIG. 4 is a graph illustrating a changed code of an output power level by setting the data shown in FIG. 2b to a reference temperature of 100.

In FIG. 4, for example, there is a difference of 23 codes for −55 dB at temperature 0. Referring back to FIG. 2b, this is the difference between the output value 42 at temperature 0 and the value 19 at normalization temperature 100. For 24 dB, FIG. 4 shows a difference of −17 codes. Referring back to FIG. 2b, this is the normalization of output value 201 of 24 dB with a reference level 218 at temperature 100. At temperature 200 in FIG. 4, there is a difference of 19 codes for 24 dB. Referring back to FIG. 2b, this is the result of normalizing code value 237 at a temperature of 200 with respect to code value 218 at temperature 100. Similarly, there is a difference of −17 codes in FIG. 4 for −55 dB at temperature 200. Referring back to FIG. 2b, this is the result of normalizing code value 2 with respect to code value 19 at temperature 100. Thus, FIG. 4 shows a code difference between a reference code value 100 of a temperature and each output level a table shown in FIG. 2b, and the graph of FIG. 4 will be understood easily by referring to the table of FIG. 2b.

Figure 5:
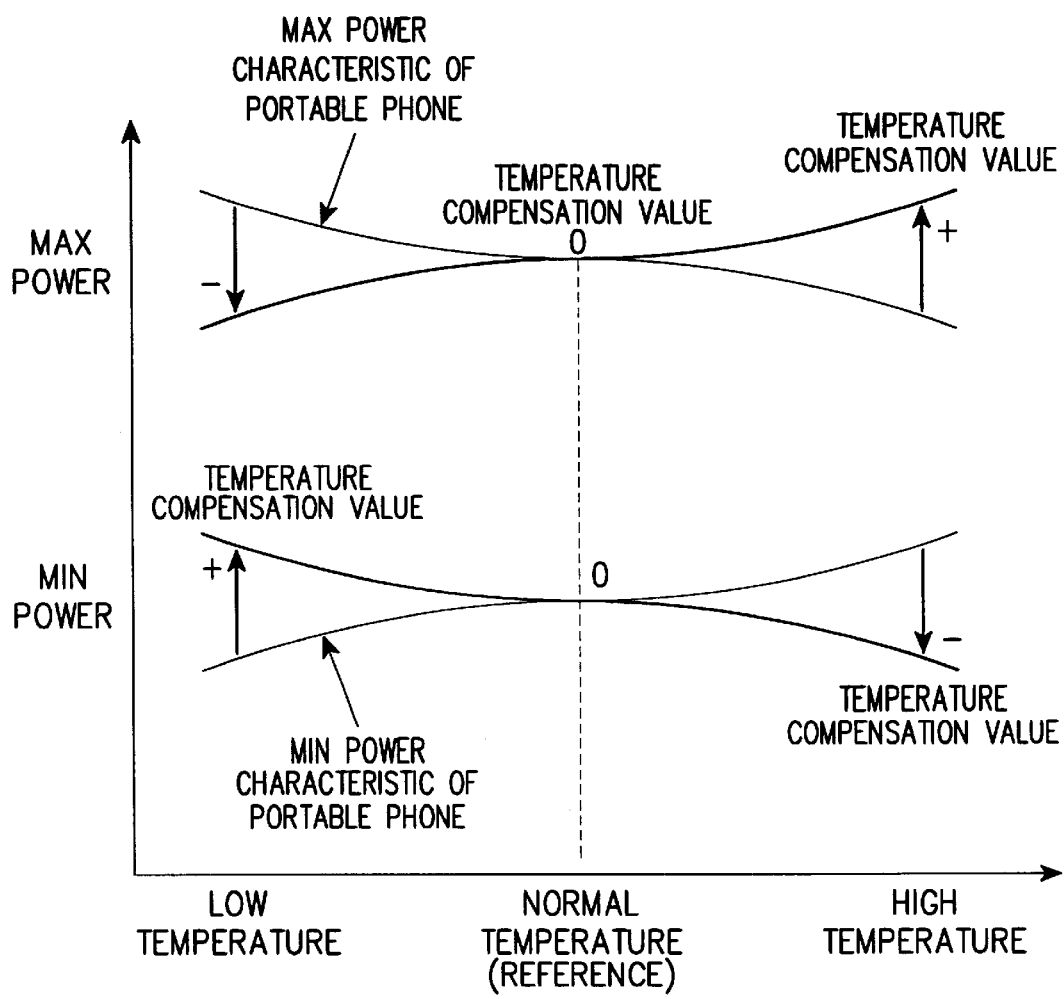
FIG. 5 is a graph illustrating an output power value according to a temperature variation to a maximum and minimum output power.

FIG. 5 is a graph illustrating sending power characteristics according to a temperature variation of a wireless terminal and a temperature compensation value for compensating the sending power characteristics as can be seen from FIG. 4. When a compensation value is set to 0 at the normal temperature, a suitable compensation value according to a temperature and a power can be obtained. Uniform linear power output characteristic despite temperature variation is desired, but the power output characteristic is seen to be in a nonlinear form in FIG. 5. Accordingly, it is required that an associated power level characteristic line should be corrected to a linear form. That is, a fine line represents a typical power level characteristic such as shown in FIG. 4, and a bold line represents a value required for correction. In other words, it can be understood that in order to change a minimum power (min power) output characteristic line to a linear form irrespective of a temperature variation, a certain value should be added to the min power output characteristic value at a low temperature, and a certain value should be subtracted from the min power output characteristic value at a high temperature. Meanwhile, it can also be understood that in order to change a maximum power (max power) output characteristic line to a linear form irrespective of a temperature variation, a certain value should be subtracted from the max power output characteristic value at a low temperature, and a certain value should be added to the max power output characteristic value at a high temperature.

Figure 6:
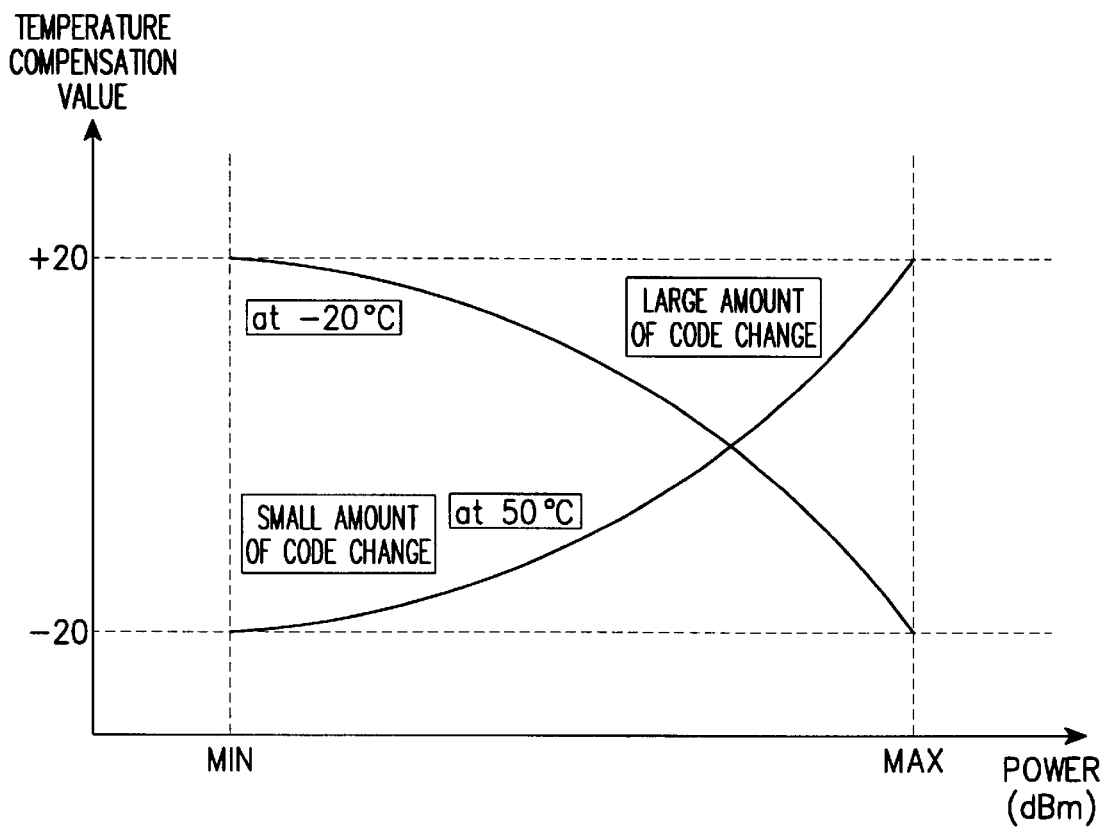
FIG. 6 is a graph illustrating a characteristic of a code change at a high and a low temperature according to an output power variation.

FIG. 6 is a graph illustrating a characteristic of a code compensation value change at a high and a low temperature according to an output power variation; and In FIG. 6, for a temperature compensation, as a result of measuring an output power of a portable terminal, for example, at 50° C., if a code temperature compensation value of a maximum power is +20, a code temperature compensation value of a minimum power is −20, an intermediate power is a code value between +20 and −20. It can be seen from a graph of FIG. 6 that the maximum power code temperature compensation value is greater than the minimum power code temperature compensation value at 50° C.

As a result of measuring the output power of the portable terminal, for example, at −20° C., if the maximum power code temperature compensation value is −20, the minimum power code temperature compensation value is +20, an intermediate power is a code value between +20 and −20. It can be seen from a graph of FIG. 6 that the minimum power code temperature compensation value is greater than the maximum power code temperature compensation value at −20° C.

Figure 7:
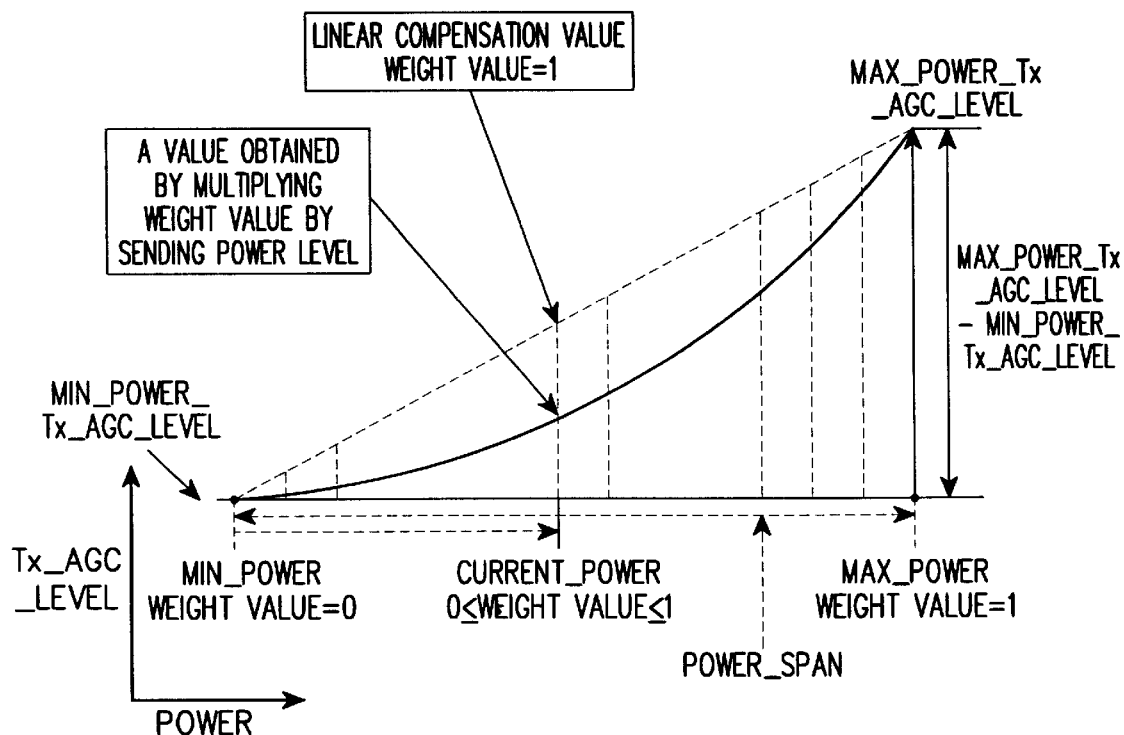
FIG. 7 is a graph for applying a temperature compensation algorithm according to an embodiment of the present invention.

FIG. 7 is a graph for applying a temperature compensation algorithm according to an embodiment of the present invention.

Now, an explanation on a temperature compensation algorithm according to the embodiment of the present invention will be in detail given hereinafter with reference to FIG. 7.

First, each code values at a maximum and minimum power according to a temperature variation (for example, −20~50° C.) is stored in a memory. The following [Table 1] represents maximum and minimum power code values for various temperatures.

TABLE 1

| Temperature | Maximum | minimum |
|---|---|---|
| 0 | 201 | 42 |
| 10 | 206 | 34 |
| 30 | 208 | 32 |
| 50 | 211 | 25 |
| 70 | 213 | 24 |
| 90 | 216 | 20 |
| 100 | 218 | 19 |
| 120 | 219 | 15 |

TABLE 1-continued

| Temperature | Maximum | minimum |
|---|---|---|
| 150 | 224 | 12 |
| 180 | 231 | 6 |
| 200 | 237 | 2 |

It is noted, of course, that the temperature values in the [Table 1] indicate simply parameters, but practical temperature values.

Typically, a code value for desired output power is obtained by using the following generalized linear function ([Expression 1]).

[Expression 1]

$$Y = mX + b$$

where Y is the desired output power, m is the slope, X is the input, and b is the offset.

Figure 1A:
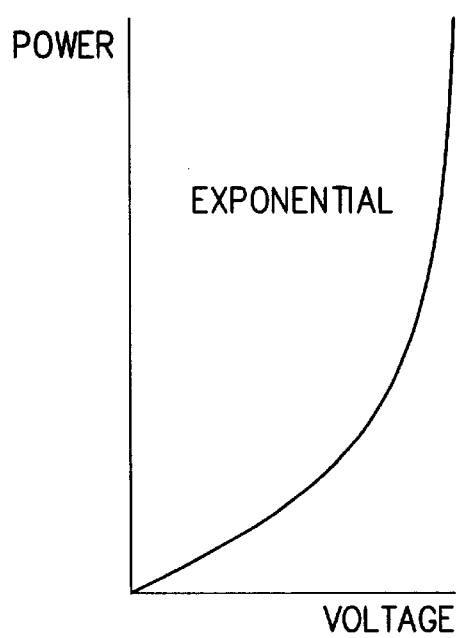
FIG. 1a is a graph illustrating input/output characteristics of an actual amplifier.
Figure 1B:
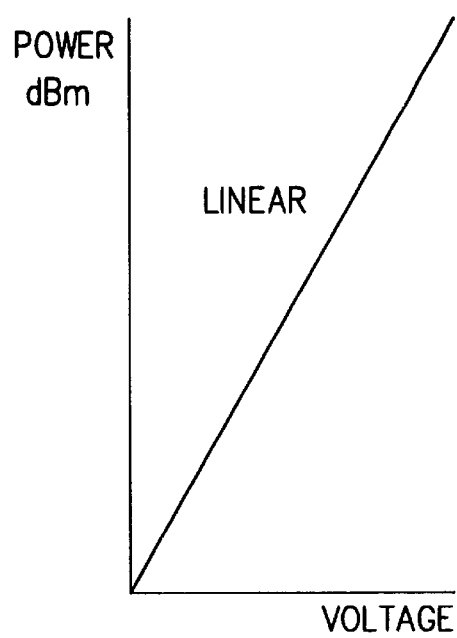
FIG. 1b is a graph illustrating input/output characteristics of an ideal amplifier.

However, since the [Expression 1] is a linear function, it is impossible to employ the nonlinear characteristic (FIG. 1a) used in a general amplifier. Accordingly, a compensation value for a sending power according to a temperature variation can be obtained by using the following linear function [Expression 2].

$$\text{compensation value} = \left[ \frac{(\max power\_tx\_agc\_level - \min power\_tx\_agc\_level)}{power\_span} \times (current\_power - \min\_power) \times weightvalue \right] + \min power\_tx\_agc\_level'$$

[Expression 2]

where, maxpower_tx_agc_level: a maximum sending power code value—a reference maximum sending power code value, minpower_tx_agc_level: a minimum sending power code value—a reference minimum sending power code value, power_span: the number of steps for power control (for example, 16 steps)

current_power: desired sending power, min_power: minimum sending power.

"The maximum sending power code value" and "minimum sending power code value" are code values stored in the memory, and "the reference maximum sending power code value" and "the reference minimum sending power code value" refer to code values at the normal temperature (a reference temperature). "The reference maximum sending power code value" and "the reference minimum sending power code value" typically have a characteristic of a linear function according to the amount of a code variation, which refer to code values of a temperature at which a sending power is changed. In the embodiment of the present invention, "the reference maximum sending power code value" and "the reference minimum sending power code value" refer to code values of a portion at which a parameter temperature is represented as "100" as shown in FIGS. 2 and 4. Accordingly, it can be seen from the table of FIG. 2 that "the reference maximum sending power code value" is "218", and "the reference minimum sending power code value" is "19" at temperature of 100.

Therefore, in a case where a current temperature parameter is "200", {maxpower_tx_agc_level} is 19 (the maximum sending power code value—the reference maximum sending power code value=237–218), whereas {minpower_tx_agc_level} is –17 (the minimum sending power code value—the reference minimum sending power code value=2–19).

At this point, the weight values stored in the memory according to each of steps are read out, and then a compensation value is obtained. The following [Table 2] represents examples of the weight values.

TABLE 2

| –55 dB | –45 dB | –35 dB | –20 dB | –9.7 dB | –4.3 dB | 1.0 dB | 6.3 dB | 11.8 dB | 18.1 dB | 22.0 dB | 24 dB |
|---|---|---|---|---|---|---|---|---|---|---|---|
| 0 | 0.3 | 0.35 | 0.39 | 0.4 | 0.45 | 0.5 | 0.55 | 0.6 | 0.8 | 0.85 | 1 |

The above weight values has a characteristic that a same weight value is multiplied by a sending power irrespective of a temperature. Accordingly, the weight value can be obtained statistically by comparison with a reference temperature through the table of FIG. 2.

Therefore, when the wireless communication terminal tries to send a minimum power at a temperature parameter 200, the weight value of [Expression 2] is "0" so that a value of a first term in [Expression 2] also is "0". As a result, only a value (–17) of a second term remains in [Expression 2]. Consequently, the compensation value is –17. Then, finally, a code value can be obtained by the following [Expression 3]

$$\text{Basic code value} = \left[ \frac{\text{reference maximum sending power code value} - \text{reference minimum sending power code value}}{power\_span} \times \text{associated step of currentpower} \right] + \text{offset}$$

In the [Expression 3], the reference maximum sending power code value is 218 and the reference minimum sending power code value is 19, a value of power_span is 16, and a value of an associated step of currentpower is 1 of a minimum value. Since the offset is an intercept of y-axis, a value of the offset at the temperature parameter 100 is 6.5625. The offset can be obtained by substituting an output power value at a reference temperature.

Therefore, a value of a first term in [Expression 3] is a value obtained by multiplying (218–19)/16 by "1", i.e. 12.4375 so that adding the value 6.5625 of the offset to 12.4375 gives a basic code value of 19. Finally, the compensated code value 2 is obtained by adding the basic code value of 19 to the compensation value (–17). The sum of a first term and a second term in [Expression 3] is a basic code value at an associated sending power value according to a reference temperature. As mentioned above, a compensated code value is obtained by adding the compensation value obtained by [Expression 2] to the basic code value.

Each of the code values (Table 1) at a maximum and minimum power according to a temperature variation, and each of the weight values (Table 2) according to a power variation obtained by an experiment are stored in a memory. Then, after a compensation value (Expression 2) at an associated sending power according to a reference temperature is calculated, a compensated code value (Expression 3) is obtained by adding the calculated compensation value to a basic code value at an associated sending power according to a reference temperature; and As described above, the method of the present invention allows the strength of an output signal according to a temperature variation to be precisely controlled, while reducing the use of power memory.

While this invention has been described in connection with what is presently considered to be the most practical and preferred embodiment, it is to be understood that the invention is not limited to the disclosed embodiment, but, on the contrary, it is intended to cover various modifications within the spirit and scope of the appended claims.

What is claimed is:

1. A method of controlling electric power according to a temperature compensation for a wireless communication terminal including a memory for storing each of code values for a maximum and minimum power corresponding to a plurality of temperature variations and weight values for a plurality of sending powers, comprising the steps of;

(a) calculating a compensation value at an associated sending power with respect to a reference temperature;

(b) calculating a basic code value at an associated sending power with respect to a reference temperature; and (c) obtaining a compensated code value by adding the compensation value to the basic code value.

2. The method according to claim 1, wherein the step (a) compensation value is calculated using the formula:

$$\text{Compensation value} = \left[ \frac{(\max power\_tx\_agc\_level - \min power\_tx\_agc\_level)}{power\_span} \times (currentpower - \min\_power) \times \text{weight value} \right] + \min power\_tx\_agc\_level$$

where, maxpower_tx_agc_level=a maximum sending power code value—a reference maximum sending power code value, minpower_tx_agc_level=a minimum sending power code value—a reference minimum sending power code value, power_span=the number of steps used for power control, currentpower=desired sending power, min_power=minimum sending power, weight value=a multiplicative factor for each sending power.

3. The method according to claim 1, wherein the step (b) basic code value is calculated using the formula:

Basic code value =

$$\left[ \frac{\text{reference maximum sending power code value} - \text{reference minimum sending power code value}}{power\_span} \times \text{associated step of currentpower} \right] + \text{offset}$$

where, power_span=the number of steps used for power control, currentpower=desired sending power, offset=an intercept of y-axis of a linear function for a reference temperature.

4. A method of controlling electric power according to a temperature compensation for a wireless communication terminal including a memory for storing code values of a maximum and minimum power corresponding to a temperature variation and weight values for a plurality of sending powers, comprising the steps of;

(a) calculating a compensation value at an associated sending power which is proportional to both the ratio of a maximum to minimum sending power at a reference temperature and a weight value corresponding to a sending power;

(b) calculating a basic code value as the amount of a code variation at an associated sending power from a linear function according to code values of a maximum and minimum sending power at a reference temperature; and (c) obtaining a compensated code value by adding the compensation value to the basic code value.

5. A method of calculating sending power code values for an electric power control according to a temperature compensation for a wireless communication terminal, comprising the steps of:

(a) detecting maximum and minimum sending powers at a current temperature;

(b) obtaining a linear function using code values of the maximum and minimum sending powers at the current temperature; and (c) calculating a code value of a sending power required at the current temperature from the linear function.

6. The method according to claim 5, wherein the linear function obtained in step (b) is given by the following expression and the code value calculated in step (c) is a basic code value calculated using the following expression:

Basic Code Value=

Basic Code Value =

$$\frac{\text{reference maximum sending power code value} - \text{reference minimum sending power code value}}{power\_span} \times \text{the number of steps for the current power} + \text{offset}$$

where:
- reference maximum sending power code value: the code value of the maximum sending power;
- reference minimum sending power code value: the code value of the minimum sending power;
- power_span: the number of steps for power control; and
- offset: an intercept of y-axis of a linear function according to a reference temperature.

7. The method according to claim 5, further comprising:

(d) storing weight values for each of a number of different sending powers in order to correct output characteristics of the sending powers outputted in a non-linear form into a linear form;

(e) calculating a compensation value for a current sending power which is proportional to both the ratio of maximum to minimum sending powers at a reference temperature and the current temperature and each of the weight values; and (f) adjusting the calculated code value of the sending power with the calculated compensation value.

8. The method according to claim 7, wherein the compensation value calculated in step (e) is calculated as follows:

$$\text{Compensation Value} = \frac{(\max power)\, tx\_agc\_level' - \min power\_tx\_agc\_level')}{power\_span} \times (currentpower - \min\_power) \times \text{weight value} + \min power\_tx\_agc\_level$$

where, maxpower_tx_agc_level: the code value of the maximum sending power—a code value of a reference maximum sending power;

minpower_tx_agc_level: the code value of the minimum sending power code value—a code value of a reference minimum sending power code value;

power_span: the number of steps for power control (for example 16 steps);

currentpower: desired sending power; and min_power: a minimum sending power.

9. The method according to claim 7, wherein the compensation value is added to the calculated code value of the required sending power in step (f).

* * * * *